US009986639B2

(12) United States Patent
Limjoco et al.

(10) Patent No.: US 9,986,639 B2
(45) Date of Patent: May 29, 2018

(54) VERTICAL MAGNETIC BARRIER FOR INTEGRATED ELECTRONIC MODULE AND RELATED METHODS

(71) Applicant: Analog Devices Global, Hamilton (BM)

(72) Inventors: Aldrick S. Limjoco, Dasmarinas Cavite (PH); Michael Cusack, Newmarket-on-Fergus (IE); Donal G. O'Sullivan, Ardnacrusha (IE); Patrick John Meehan, Pallaskenry (IE); Thomas Conway, Limerick (IE)

(73) Assignee: Analog Devices Global, Hamilton (BM)

( * ) Notice: Subject to any disclaimer, the term of this patent is extended or adjusted under 35 U.S.C. 154(b) by 105 days.

(21) Appl. No.: 14/754,241

(22) Filed: Jun. 29, 2015

(65) Prior Publication Data
US 2016/0380606 A1 Dec. 29, 2016

(51) Int. Cl.
*H05K 7/10* (2006.01)
*H05K 7/12* (2006.01)
(Continued)

(52) U.S. Cl.
CPC .......... *H05K 1/111* (2013.01); *H01L 23/3107* (2013.01); *H01L 23/49541* (2013.01);
(Continued)

(58) Field of Classification Search
CPC ....... H05K 9/0032; H05K 1/141–1/144; G06F 1/182
(Continued)

(56) References Cited

U.S. PATENT DOCUMENTS 4,916,380 A 4/1990 Burroughs
6,614,102 B1 9/2003 Hoffman et al.
(Continued)

FOREIGN PATENT DOCUMENTS

CN 104716107 A 6/2015

OTHER PUBLICATIONS

"U.S. Appl. No. 13/484,636, Non Final Office Action dated Apr. 15, 2014", 12 pgs.
(Continued)

*Primary Examiner* — Tuan T Dinh
(74) *Attorney, Agent, or Firm* — Schwegman Lundberg & Woessner, P.A.

(57) ABSTRACT

An integrated electronic component assembly can include an electrically-conductive structure comprising two or more electrically-conductive terminals accessible on an exterior of the integrated electronic component assembly, a first component attachment region for a first component within the integrated electronic component assembly, and a second component attachment region for a second component within the integrated electronic component assembly. The integrated electronic component assembly can include an electrically-conductive magnetically-permeable shield coupled to or defined by the electrically-conductive structure, the electrically-conductive magnetically-permeable shield located between the first and second component attachment regions, including a portion extending in a direction out of a plane defined by the first and second component attachment regions, to suppress magnetic coupling between the first and second components.

20 Claims, 6 Drawing Sheets

(51) Int. Cl.
- *H05K 1/11* (2006.01)
- *H01L 23/31* (2006.01)
- *H01L 23/552* (2006.01)
- *H01L 25/16* (2006.01)
- *H01L 23/495* (2006.01)
- *H05K 3/30* (2006.01)
- *H05K 3/28* (2006.01)
- *H05K 1/18* (2006.01)
- *H05K 1/02* (2006.01)

(52) U.S. Cl.
CPC ...... *H01L 23/49575* (2013.01); *H01L 23/552* (2013.01); *H01L 25/16* (2013.01); *H05K 1/0218* (2013.01); *H05K 1/181* (2013.01); *H05K 3/284* (2013.01); *H05K 3/303* (2013.01); *H01L 2224/48247* (2013.01); *H01L 2924/19105* (2013.01); *H05K 2201/1003* (2013.01); *H05K 2201/1006* (2013.01)

(58) Field of Classification Search
USPC ............... 361/763–764, 782–787, 813–818; 257/685–686
See application file for complete search history.

(56) References Cited

U.S. PATENT DOCUMENTS

| | | |
|---|---|---|
| 6,642,811 B2 | 11/2003 | Daniels et al. |
| 6,906,396 B2 | 6/2005 | Tuttle et al. |
| 7,459,769 B2 | 12/2008 | Kato et al. |
| 8,885,376 B2 | 11/2014 | Meehan et al. |
| 2006/0019422 A1 | 1/2006 | Tuttle et al. |
| 2007/0153491 A1* | 7/2007 | Lee ............... H01L 23/552 361/790 |
| 2009/0146760 A1 | 6/2009 | Reefman et al. |
| 2009/0168386 A1* | 7/2009 | Suzuki ............ H01L 23/552 361/810 |
| 2013/0320943 A1 | 12/2013 | Meehan et al. |
| 2014/0022020 A1 | 1/2014 | Aaen et al. |
| 2014/0312997 A1 | 10/2014 | Dale |

OTHER PUBLICATIONS

"U.S. Appl. No. 13/484,636, Notice of Allowance dated Jul. 9, 2014", 5 pgs.

"U.S. Appl. No. 13/484,636, Response filed Jun. 5, 2014 to Non Final Office Action dated Apr. 15, 2014", 9 pgs.

* cited by examiner

VERTICAL MAGNETIC BARRIER FOR INTEGRATED ELECTRONIC MODULE AND RELATED METHODS

BACKGROUND

Integrated electronic modules can be used to perform a variety of functions. For example, such modules can include one or more passive components and interconnections, such as to provide a single unitized module assembly that can placed upon a printed circuit board assembly. Such a module can include circuits for performing various functions, such as providing a passive filter, for example, or for providing more complex functionality, such as including one or more monolithic integrated circuits or active devices. A monolithic integrated circuit can include one or more of active devices such as transistors, or passive devices such as resistors, inductors, or capacitors, and interconnections. Such a monolithic integrated circuit can be fabricated upon or include a semiconductor substrate. Limitations can exist with respect to a magnitude of passive component values that can be implemented using a monolithic integrated circuit. Accordingly, in certain applications, a monolithic integrated circuit can be coupled to one or more components located "off-chip," but such components may still be included within the integrated electronic module package.

In one illustrative application, a monolithic integrated circuit can include a power supply controller circuit such as including one or more of analog or digital circuitry forming a portion of a regulated power supply. A combination of the integrated circuit and other off-chip components can provide a regulated power supply circuit. Components separate from the integrated circuit can include an energy storage element (e.g., an inductor), and other circuitry such as one or more large bypass capacitors or power switching devices (e.g., power transistors). Use of bypass capacitors may still result in undesired levels of output ripple (e.g., output voltage variation or noise deviating from the nominal regulated output voltage) under a variety of load conditions. Accordingly, different techniques can be used to provide filtering or suppression of ripple. In one approach, a tuned filter circuit can be used to attenuate ripple, such as having a stop band corresponding to a fundamental frequency of the ripple signal.

OVERVIEW

In an example, one or more components can be located within a commonly-shared electronic component module package. The components can include one or more passive components such as one or more inductive devices (such as including an inductor or transformer), one or more capacitors, or one or more resistors. Instead or in addition, the components can include one or more monolithic integrated circuit dice. A spacing and orientation of separate components within the integrated electronic component module package may result in undesired electrical coupling between the components, even if no conductive coupling path exists between such components.

For example, if the components include inductors, undesired mutual magnetic coupling can occur between such inductors. Undesired mutual magnetic coupling can undesirably impact circuit function, such as shifting an operational frequency or altering a quality factor of a tuned circuit, or causing undesired sensitivity to process or other variations, such as component value variations, or sensitivity to varying operating conditions across load and temperature. Other forms of undesired coupling such as capacitive or electrostatic coupling can occur, which can also impact circuit function.

The present inventors have recognized, among other things, that such undesired electrical coupling can be exacerbated when components such as inductors are located close together in a densely-populated integrated electronic module package having a compact package geometry. Such compact geometries can include, but are not limited to, a chip-scale-package (CSP) or near-CSP form factor. In an illustrative example, a CSP or near-CSP module can include a monolithic integrated circuit containing at least a portion of a direct-current-to-direct-current (DC-DC) switched-mode regulator, along with discrete components (e.g., one or more resistors, capacitors, or inductors), such as to provide a highly-integrated module. Such a module can have a smaller footprint or simpler implementation in an application circuit by an end user, as compared to a power supply circuit comprising a single packaged monolithic integrated circuit coupled to external components on a printed circuit board assembly. In another example, an integrated electronic component module can include two or more passive components, such as to provide a single component module implementing a filter or other signal conditioning circuit, such as to provide an integrated passive filter module that can be positioned and placed in a printed circuit board assembly as a single unitized module assembly. The present inventors have also recognized, among other things, that an electrically-conductive magnetically-permeable shield can be included in an integrated electronic component module, such as to suppress or inhibit mutual magnetic coupling between certain components. Such an electrically-conductive magnetically-permeable shield can be electrically-conductive and magnetically-permeable. Such a shield can also provide electrostatic shielding, such as to reduce capacitive coupling between the components.

In an example, an integrated electronic component assembly can include an electrically-conductive structure comprising two or more electrically-conductive terminals accessible on an exterior of the integrated electronic component assembly, a first component attachment region for a first component within the integrated electronic component assembly, and a second component attachment region for a second component within the integrated electronic component assembly. The integrated electronic component assembly can include an electrically-conductive magnetically-permeable shield coupled to or defined by the electrically-conductive structure, the electrically-conductive magnetically-permeable shield located between the first and second component attachment regions, including a portion extending in a direction out of a plane defined by the first and second component attachment regions, to suppress magnetic coupling between the first and second components.

This overview is intended to provide an overview of subject matter of the present patent application. It is not intended to provide an exclusive or exhaustive explanation of the invention. The detailed description is included to provide further information about the present patent application.

Figure 1A:
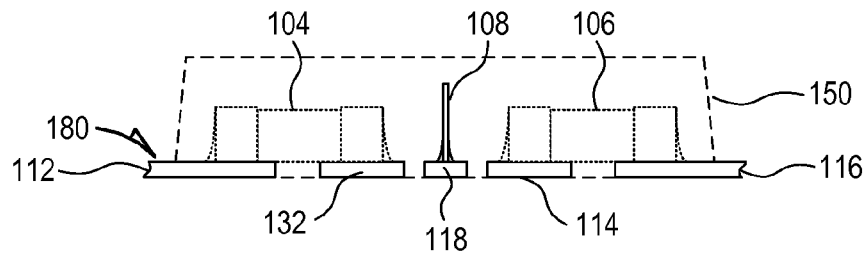
FIG. 1A illustrates generally at least a portion an integrated electronic module, including an electrically-conductive structure such as comprising a lead frame.

In the drawings, which are not necessarily drawn to scale, like numerals may describe similar components in different views. Like numerals having different letter suffixes may represent different instances of similar components. The drawings illustrate generally, by way of example, but not by way of limitation, various embodiments discussed in the present document.

DETAILED DESCRIPTION

FIG. 1A illustrates generally at least a portion an integrated electronic module, including an electrically-conductive structure 180 such as comprising a lead frame of an integrated module package. The electrically-conductive structure 180 can include or define two or more electrically-conductive terminals, such as terminals accessible to an exterior of an integrated electronic module assembly, such as accessible on or beyond a surface of an encapsulant 150. The electrically-conductive structure 180 can define or otherwise include one or more component attachment regions, such as a first component attachment region established to provide electrical and mechanical connections for a first component 104, and a second component attachment region established to provide electrical and mechanical connections for a second component 106.

The first component attachment region can include one or more lands or "pads" comprising the electrically-conductive structure 180, such as a conductor 112 and a conductor 132. The conductor 112 can be electrically coupled to a terminal or can define a terminal extending beyond the encapsulant region 150, such as shown illustratively in FIG. 1A. A second component attachment region can also include one or more lands or "pads" comprising the electrically-conductive structure 180 such as a conductor 114 and a conductor 116. The conductor 116 can also be electrically coupled to a terminal or can define a terminal extending beyond the encapsulant region 150, as shown illustratively in FIG. 1A. As shown and described elsewhere herein, the present inventors have recognized, among other things, that unwanted electrical coupling between components, such as between the first and second components 104 and 106, can be suppressed or inhibited such as using an electrically-conductive magnetically-permeable shield 108, such as electrically and mechanically coupled to a shield region 118 of the electrically-conductive structure 180. Alternatively, or in addition, the magnetically-permeable shield 108 can be defined by or formed from a portion of the electrically-conductive structure 180, such as shown illustratively in the example of FIG. 2B. As shown in FIG. 1A and described in other examples elsewhere herein, the electrically-conductive magnetically-permeable shield 108 can include a portion extending in a direction out of a plane defined by the first and second component attachment regions of the electrically-conductive structure 180, such as to suppress magnetic coupling between the first and second components 104 and 106.

Figure 1B:
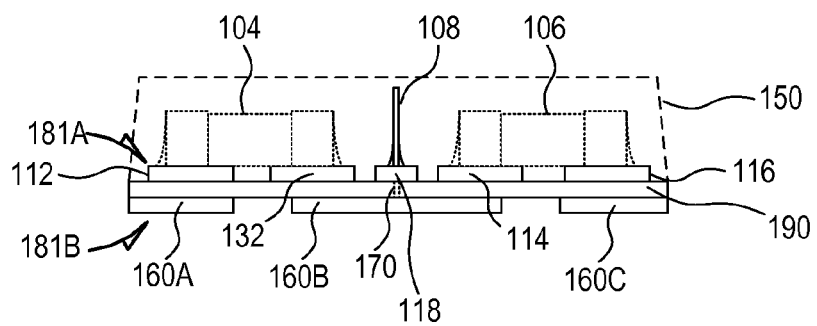
FIG. 1B illustrates generally at least a portion an integrated electronic module, including a dielectric substrate and an electrically-conductive structure such as comprising a metallization layer coupled to the dielectric substrate.

FIG. 1B illustrates generally at least a portion an integrated electronic module, including a dielectric substrate and an electrically-conductive structure such as comprising a first metallization layer 181A coupled to the dielectric substrate 190. The dielectric substrate can include a glass-epoxy or other laminate, such as mechanically coupled to the first metallization layer 181A or another electrically-conductive structure. A second metallization layer 181B can be coupled to a surface of the dielectric layer 190 opposite the first metallization layer 181A, or a multi-layer stack-up can be used having three or more metallization layers. Interconnections between metallization layers can be provided by one or more via structures such as via 170.

As similarly described in relation to the example of FIG. 1A, the integrated module generally includes an electrically-conductive structure, such as the first metallization layer 181A, having conductors 112, 132, 114, and 116, such as to provide electrical and mechanical attachment regions for the first and second components 104 and 106. The electrically-conductive magnetically-permeable shield 108 can be electrically and mechanically coupled to the first metallization layer 181A, or defined by a portion of the first metallization layer 181A, such as to suppress magnetic coupling between the components 104 and 106 within the integrated electronic component module.

After the first metallization layer 181A is populated with components, such as first and second components 104 and 106, and an electrically-conductive magnetically-permeable shield 108 is formed or populated in a shield region 118, an encapsulant 150 can be provided to encapsulate the module. One or more terminals can be accessible on an exterior of the integrated electronic module, such as a first conductive land 160A, a second conductive land 160B, or a third conductive land 160C. Such lands can form a portion of an array (e.g., a land array or solder-bumped ball array), such as for electrically connecting the integrated component module to another assembly, such as a printed circuit board assembly.

Figure 1C:
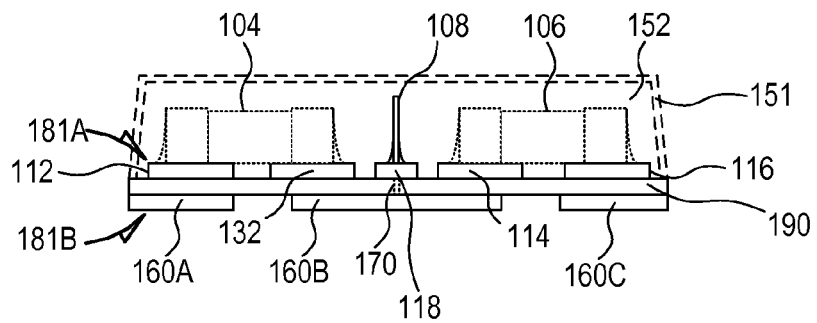
FIG. 1C illustrates generally at least a portion an integrated electronic module, including a dielectric substrate and an electrically-conductive structure such as comprising a metallization layer coupled to the dielectric substrate.

FIG. 1C illustrates generally at least a portion an integrated electronic module, including a dielectric substrate and an electrically-conductive structure such as comprising a first metallization layer 181A coupled to the dielectric substrate 190. As in the example of FIG. 1B, the dielectric substrate 190 can include a laminate, such as mechanically coupled to the first metallization layer 181A or another electrically-conductive structure. A second metallization layer 181B can be coupled to a surface of the dielectric layer 190 opposite the first metallization layer 181A, or a multi-layer stack-up can be used having three or more metallization layers. Interconnections between metallization layers can be provided by one or more via structures such as via 170.

As similarly described in relation to the example of FIG. 1A, the integrated module can include an electrically-conductive structure, such as the first metallization layer 181A, having conductors 112, 132, 114, and 116, such as to provide electrical and mechanical attachment regions for the first and second components 104 and 106. The electrically-conductive magnetically-permeable shield 108 can be electrically and mechanically coupled to the first metallization layer 181A, or defined by a portion of the first metallization layer 181A, such as to suppress magnetic coupling between the components 104 and 106 within the integrated electronic component module. One or more terminals can be accessible on an exterior of the integrated electronic module, such as a first conductive land 160A, a second conductive land 160B, or a third conductive land 160C.

After the first metallization layer 181A is populated with components, such as first and second components 104 and 106, and an electrically-conductive magnetically-permeable shield 108 is formed or populated in a shield region 118, a cover 151 can be provided. By contrast with the example of FIG. 1B, the cover 151 can define a cavity 152. For example, the integrated electronic component module can be used in a communications application or high-frequency application (such as can include circuitry configured to operate in a microwave range of frequencies or beyond). A dielectric permeability of the cavity 152 can be near unity (e.g., including a vacuum, air, or an inert environment), such as to preserve or establish one or more operating characteristics that may otherwise be affected by use of a solid encapsulant lacking a cavity. According to various examples, the cover 151 can include an epoxy or other encapsulant, such as formed or molded to define the cavity 152. In another example, the cover 151 can include a lid, such as comprising an electrically-conductive material, which can be mechanically fixed to a substrate, such as to the dielectric layer 190 or a portion of the metallization layer 181A. For example, the cover 151 can be soldered or welded to a conductive ring formed in the metallization layer 181A. The cavity 152 can be hermetically isolated form an environment surrounding the integrated electronic component module.

Figure 1D:
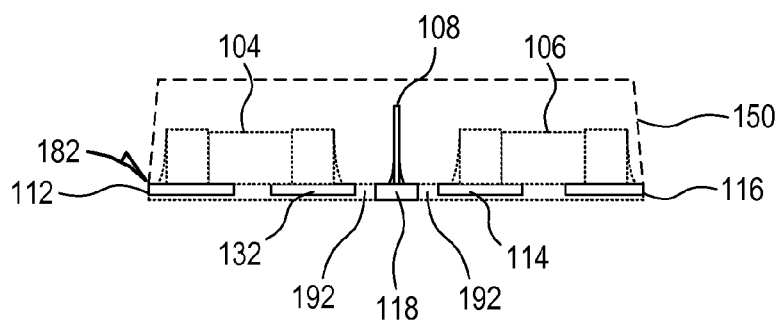
FIG. 1D illustrates generally at least a portion of an integrated electronic module, such as having an electrically-conductive "fan out" structure defined by plated regions, and a dielectric fill material.

FIG. 1D illustrates generally at least a portion of an integrated electronic module, such as having an electrically-conductive "fan out" structure 182 defined by plated regions, and a dielectric fill material 192 located in regions or voids between portions of the electrically-conductive structure 182. As in other examples described herein, the electrically-conductive structure 182 can provide regions for electrical and mechanical attachment of components, such as a first component attachment region defined at least in part by conductors 112 and 132, and a second component attached region defined at least in part by conductors 114 and 116. A shield 108 can be populated or formed in a shield region 118. The shield region 118 can include a portion of the conductive structure 182, such as can be electrically connect internally or externally to a reference potential (e.g., connected to a common reference or "ground" node). An encapsulant 150 can be provided, such as described in other examples.

In the examples of FIG. 1A, FIG. 1B, FIG. 1C, or FIG. 1D, the electrically-conductive magnetically-permeable shield 108 can concentrate lines of flux. Such flux concentration can one or more of redirect or "short out" (e.g., attenuate) lines of flux generated by or coupled between the components 104 and 106, such as to inhibit or suppress linkage of such flux between the components 104 and 106. The electrically-conductive magnetically-permeable shield 108 can be conductively coupled to a reference node, such as one or more of internally coupled to another structure within the electronic module, or conductively coupled to a terminal, such as a reference terminal provided by the shield region 118. The electrically-conductive magnetically-permeable shield 108 can extend in a direction out of a plane defined by the first and second component attachment regions of an electrically-conductive structure, such as perpendicular to other portions of the electrically-conductive structure.

The components 104 and 106 of FIG. 1A, FIG. 1B, FIG. 1C, and FIG. 1D are shown has rectangular in cross section, and including end-terminals, such as soldered or otherwise electrically and mechanically coupled to the electrical conductive structure. However, other component types or packages can be used along with the shield 108 configuration shown in the examples above or described elsewhere herein. For example, the first and second components can include semiconductor dice, such as wire bonded to one or more conductive regions of the conductive structure, and having a shield 108 located between the semiconductor dice. Such dice can include one or more of monolithic integrated circuits, or active device dice (e.g., power transistors or other switching devices).

Figure 2A:
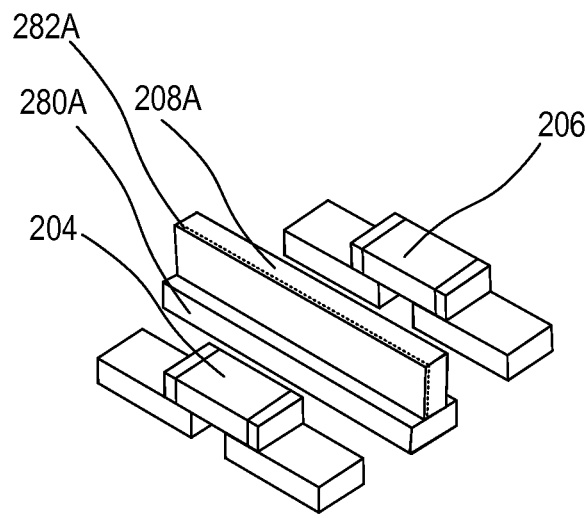
FIG. 2A illustrates generally a portion of an integrated electronic module, such as including an electrically-conductive structure and an electrically-conductive magnetically-permeable shield electrically and mechanically coupled to the electrically-conductive structure.
Figure 2B:
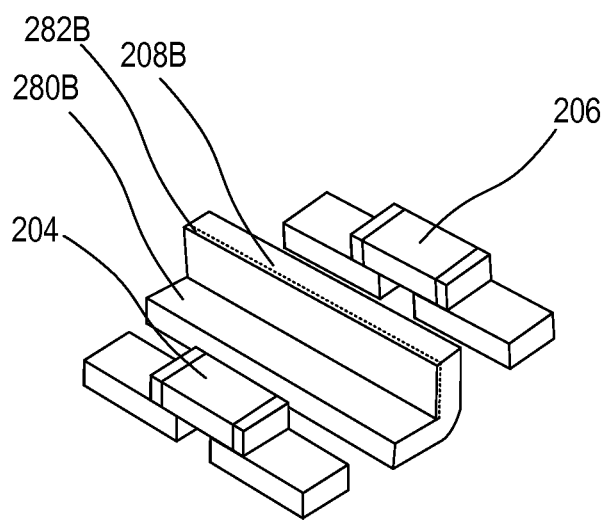
FIG. 2B illustrates generally a portion of an integrated electronic module, such as including an electrically-conductive structure that includes a portion defining an electrically-conductive magnetically-permeable shield.

FIG. 2A illustrates generally a portion of an integrated electronic module, such as including an electrically-conductive structure 280A and an electrically-conductive magnetically-permeable shield 208A electrically and mechanically coupled to the electrically-conductive structure 280A, within the module. FIG. 2B illustrates generally a portion of an integrated electronic module, such as including an electrically-conductive structure 280B that includes a portion defining an electrically-conductive magnetically-permeable shield 208B.

In the illustrative examples of FIGS. 2A and 2B, first and second components 204 and 206 are shown oriented with a long axis of each of the components 204 and 206 parallel to each other. Other orientations are possible, such having short axes parallel to each other or having the components 204 and 206 rotated so that the long axes are anti-parallel, such as to further reduce or suppress coupling between the components. As mentioned above and elsewhere herein, the present inventors have recognized that components such as inductors located in proximity with each other can exhibit undesired electrical coupling. In an example, to suppress undesired magnetic coupling between components such as the first and second components 204 and 206, the electrically-conductive structure 280A or 280B can provide a shield region such as conductively coupled to an electrically-conductive magnetically-permeable shield 208A (e.g., as shown in FIG. 2A) or defining an electrically-conductive magnetically-permeable shield 208B (e.g., as shown in FIG. 2B).

The electrically-conductive magnetically-permeable shield 208A or 208B can be referred to as a "vertical" shield located laterally between components 204 and 206 (in addition to or instead of locating shielding material above or below components within a module). Use of a vertically-oriented shield located laterally between components can be less complex than incorporation of a shield elsewhere, such as above or below the electrically-conductive structure 280A or 280B, or above or below components 204 or 206, because the shield can be formed during fabrication of the conductive structure itself or populated in-line with other operations such as component installation, such as before encapsulation.

The electrically-conductive magnetically-permeable shield 208A or 208B can include a material similar to other portions of the electrically conductive structure 280A or 280B, or the electrically-conductive magnetically-permeable shield 208A or 208B can include a different material. For example, a material having a magnetic permeability much greater than unity can generally be used to provide magnetic shielding, and such a material can be generally referred to as magnetically-permeable. Such materials can include alloys comprising iron, nickel, cobalt, silicon, chrome, molybdenum, or combinations thereof. For example, mu metal can be used (e.g., having a relative magnetic permeability greater than about 10,000). A variety of materials can be used having a magnetic permeability of greater than about 1,000 and less than about 1,000,000, including silicon steel or other electrical-grade steel, or iron.

The electrically-conductive magnetically-permeable shield 208A can be mechanically and conductively coupled to the electrically conductive structure 280A, or to other portions of an electronic module, such as using a solder or a conductive adhesive (e.g., conductive epoxy). However, as shown in the example of FIG. 2B, the electrically-conductive magnetically-permeable shield 208B need not be a separate component within an electronic module. For example, the shield 280B can be formed from a portion of the electrically-conductive structure 280B, such as by bending or otherwise forming a portion of the electrically-conductive structure 280B to include a portion extending in a perpendicular direction. For compatibility with existing fabrication processes and materials, the electrically-conductive magnetically-permeable shield 208A or 208B can be clad or plated with another material layer 282A or 282B. For example, if the electrically-conductive structure 280A or 280B is non-magnetic or only weakly magnetically-permeable, the material layer 282A or 282B can be used to enhance a magnetic permeability of the electrically-conductive magnetically-permeable shield 208A or 208B.

Figure 3:
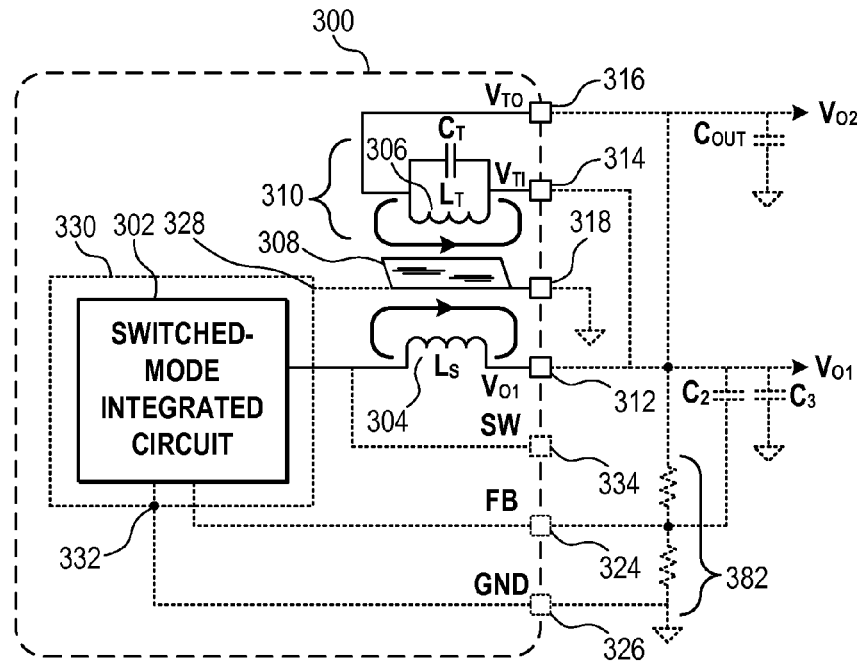
FIG. 3 illustrates generally an illustrative example of a circuit diagram representing an integrated electronic module, such as can include various components.

FIG. 3 illustrates generally an illustrative example of a circuit diagram representing an integrated electronic module 300, such as can include various components, including an electrically-conductive magnetically-permeable shield 308. The electronic module 300 can house various circuits, such as a portion or entirety of a regulated power supply circuit. For example, the module 300 can include an integrated circuit die attachment region 330, such as can include a conductive pad. The conductive pad can be conductively coupled to an exterior of the electronic module 300, such as using a coupling 332 to one or more reference pins (e.g., a ground pin GND 326), or through an exposed region of the electronic module 300 package, such as a thermal pad.

An integrated circuit die such as a switched-mode integrated circuit 302 including portion of a regulator circuit can be housed within the module 300. In one approach, discrete components can be located outside the electronic module 300. Such components can include storage elements such as a storage inductor, and filter components such as an inductor included as a portion of an output filter circuit. By contrast, the present inventors have recognized that discrete components can be located within a densely-integrated electronic component module 300, such as to one or more of reduce printed circuit board (PCB) area occupied by the regulator circuit or reduce total bill-of-materials (BOM) component count. Some components may still be located outside the electronic module 300 package, such as a large output capacitor (e.g., $C_{OUT}$), or feedback elements such as a feedback resistor network 382. Other components can include intermediate filtering or coupling capacitors such as $C_2$, or $C_3$. However, placing at least some components within the electronic module 300 package, in addition to a monolithic integrated circuit such as the switched-mode integrated circuit 302, can still result in area savings and simplification of application circuit design including the electronic module 300.

The switched-mode integrated circuit 302 can include analog and digital circuitry, such as control or supervision circuitry, an error amplifier, transistor drivers, power transistors, voltage references, or other circuitry. The electronic module 300 can include an encapsulated or sealed device package having various conductive signal pins (e.g., terminals). In an example including a switched-mode regulated power supply circuit, the pins can include a reference pin (e.g., the ground or GND 326 pin), a feedback pin (e.g., FB 324), a switched current output pin (e.g., SW 334) such as coupleable to a storage device, a first voltage output pin (e.g., $V_{O1}$ 312), a filter input pin (e.g., $V_{TI}$ 314), and a filter output pin (e.g., $V_{TO}$ 316). As mentioned above, the present inventors have recognized among other things that an internal storage inductor (e.g., $L_S$ 304) can be located within the electronic module 300, such as coupled to a switched output of the switched-mode integrated circuit 302. A ripple filter 310 can be co-integrated within the module and can include a tuned notch-filter topology, such as having a capacitor (e.g., $C_T$) and an inductor (e.g., $L_T$ 306), forming an "LC" tank network.

The present inventors have also recognized, among other things, that mutual magnetic coupling, such as between the storage inductor $L_S$ 304 and the tank inductor $L_T$ 306, can detune a notch frequency of the tuned filter circuit 310, such as degrading ripple-rejection performance. A coupling coefficient between the inductors can influence the degree of shifting or "pulling" of the tuned filter circuit 310 notch frequency. According to the result of the simulation illustrated generally in FIG. 5, such a coupling coefficient—even if at about 0.01% or less—can still create a significant frequency shift, such as degrading an attenuation factor provided by the tuned filter circuit at the desired center frequency, such as a switching frequency of the regulator circuit.

Accordingly, the present inventors have recognized that control over placement and orientation of the inductors, alone, may be insufficient to avoid undesired magnetic coupling, and that an electrically-conductive magnetically-permeable shield 308 can be included, such as concentrate lines of flux (as shown by oval-shaped regions with arrows). Such flux concentration can one or more of redirect or "short out" (e.g., attenuate) lines of flux generated by each of the inductors, such as to inhibit or suppress linkage of such flux between the inductors 304 and 306. The electrically-conductive magnetically-permeable shield can be conductively coupled to a reference node, such as one or more of internally coupled at a location 328 to another "grounded" structure within the electronic module 300, or conductively coupled to a pin, such as another reference pin 318.

The electrically-conductive magnetically-permeable shield 308 can extend in a direction outward (e.g., perpendicular) to a plane of the electronic module 300. For example, the shield 308 can be attached to a lead frame, a metallization layer of a substrate, or another electrically conductive structure comprising the electronic module 300. As shown and described in other examples, the shield 308 can be formed from a similar material as other portions of the electronic module 300, such as formed from a portion of a lead frame, or the shield can include a different material, such as a material having a relative magnetic permeability much greater than unity.

Figure 4:
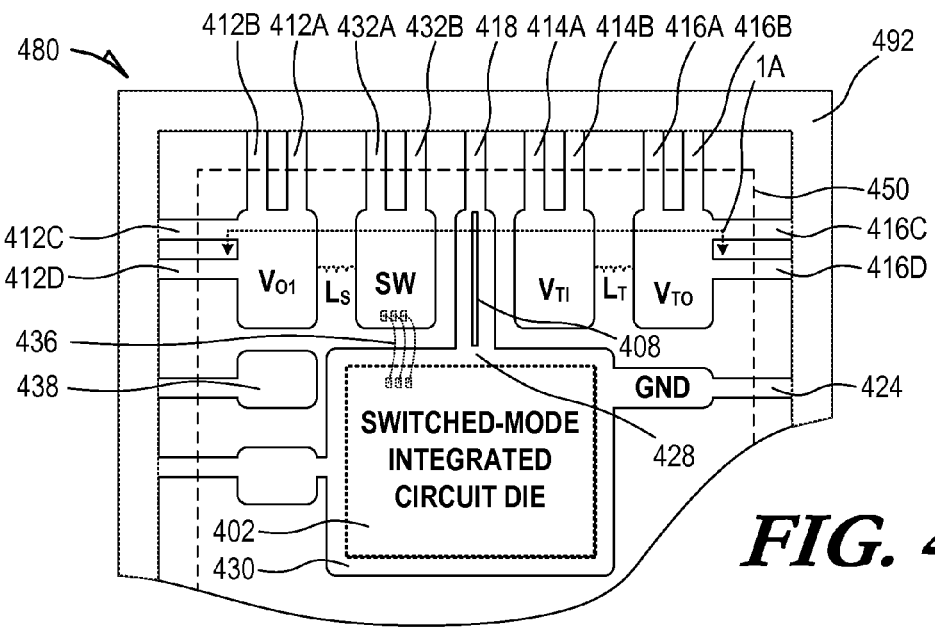
FIG. 4 illustrates generally an illustrative example of at least a portion of an integrated electronic module, such as can include an electrically-conductive structure defining various component attachment regions interconnected according to the illustrative example of the circuit diagram of FIG. 3.

FIG. 4 illustrates generally an illustrative example of at least a portion of an integrated electronic module, such as can include an electrically-conductive structure 480 defining various component attachment regions interconnected according to the illustrative example of the circuit diagram of FIG. 3. The electrically-conductive structure 480 can include a lead frame, or a metallization layer within an electronic module package, for example. The electrically-conductive structure 480 can define various regions, such as pads where a first inductor (e.g., a storage inductor $L_S$), and a second inductor (e.g., a tuned filter circuit inductor $L_T$) can be conductively and mechanically attached. Such attachment can include use of a solder or conductive adhesive (e.g., a conductive epoxy). An integrated circuit die, such as a switch-mode integrated circuit die 402 can be mechanically attached to the integrated circuit die attachment region 430. In an example, the integrated circuit die 402 can be conductively coupled to the electrically-conductive structure 480, such as where the attachment region 430 provides one or more of a reference conductor (e.g., GND) that is electrically "tied" to the substrate of the integrated circuit die 402, or a thermal pad to provide thermal conduction away from the integrated circuit die 402. Electrical interconnections between the integrated circuit die 402 and other portions of the electrically-conductive structure 480 include using bond wires 436 as shown illustratively in relation to the switched node SW in FIG. 4. In a lead frame example, conductive portions of the electrically-conductive structure 480 can extend beyond an encapsulation region 450, at least during fabrication, so as to provide interconnect pins for a module comprising the lead frame, components, and encapsulant (e.g., an epoxy or other material). Generally, a conductive lead frame can be fabricated as a portion of a panel or array of lead frames, such as using one or more of stamping or etching. Individual lead frames can be singulated from the panel or array, such before or after population with components, encapsulation, or other operations. Lead frame materials can include one or more metals or alloys, such as can include copper or a copper alloy, for example. In the illustrative example of a switched-mode power supply regulator circuit, multiple pins can be conductively coupled to a single pad or portion of the electrically-conductive structure 480, such as output voltage pins 412A, 412B, 412C, 412D coupled to a first pad of a first inductor attachment region, switched-node pins 432A and 432B coupled to a second pad of the first inductor attachment regions, tuned filter circuit output pins 416A, 416B, 416C, 416D coupled to a first pad of a second inductor attachment region, and tuned filter circuit input pins 414A and 414B coupled to a second pad of the second inductor attachment region. Other pads located elsewhere can provide touch-down locations for wire bonds electrically coupling the integrated circuit die 402 to the electrically-conductive structure 480, such as a pad 438. As shown illustratively in FIG. 1B and FIG. 1C, the electrically-conductive structure 480 can, but need not, form a portion of a multi-layer structure comprising an electronic module package.

Portions of the electrically-conductive structure 480 extending beyond the encapsulant region can be one of trimmed or formed (e.g., removing an outer portion 492 of the electrically-conductive structure 480 as in a lead frame example), such as to provide electronic module "pins" for interconnection with other devices, such as when the module is placed upon and soldered to a printed circuit board (PCB) assembly. After encapsulation and singulation of a module assembly, portions of the pins can be exposed on one or more of a lateral edge or an underside of the encapsulation region 450 to permit attachment of the electronic module 300 to a PCB assembly. Exposed terminal pins can be passivated or treated with another material (e.g., plated or tinned). In an illustrative example, the electrically-conductive structure 480 can include a lead frame as a portion of module having a lead frame chip-scale package (LFCSP) geometry.

The examples of FIG. 3 and FIG. 4 are illustrative in nature. The present inventors have recognized that such internal magnetically-permeable shielding can be used between components other than inductors, or in applications other than highly-integrated switched-mode power supply regulator circuits.

Figure 5:
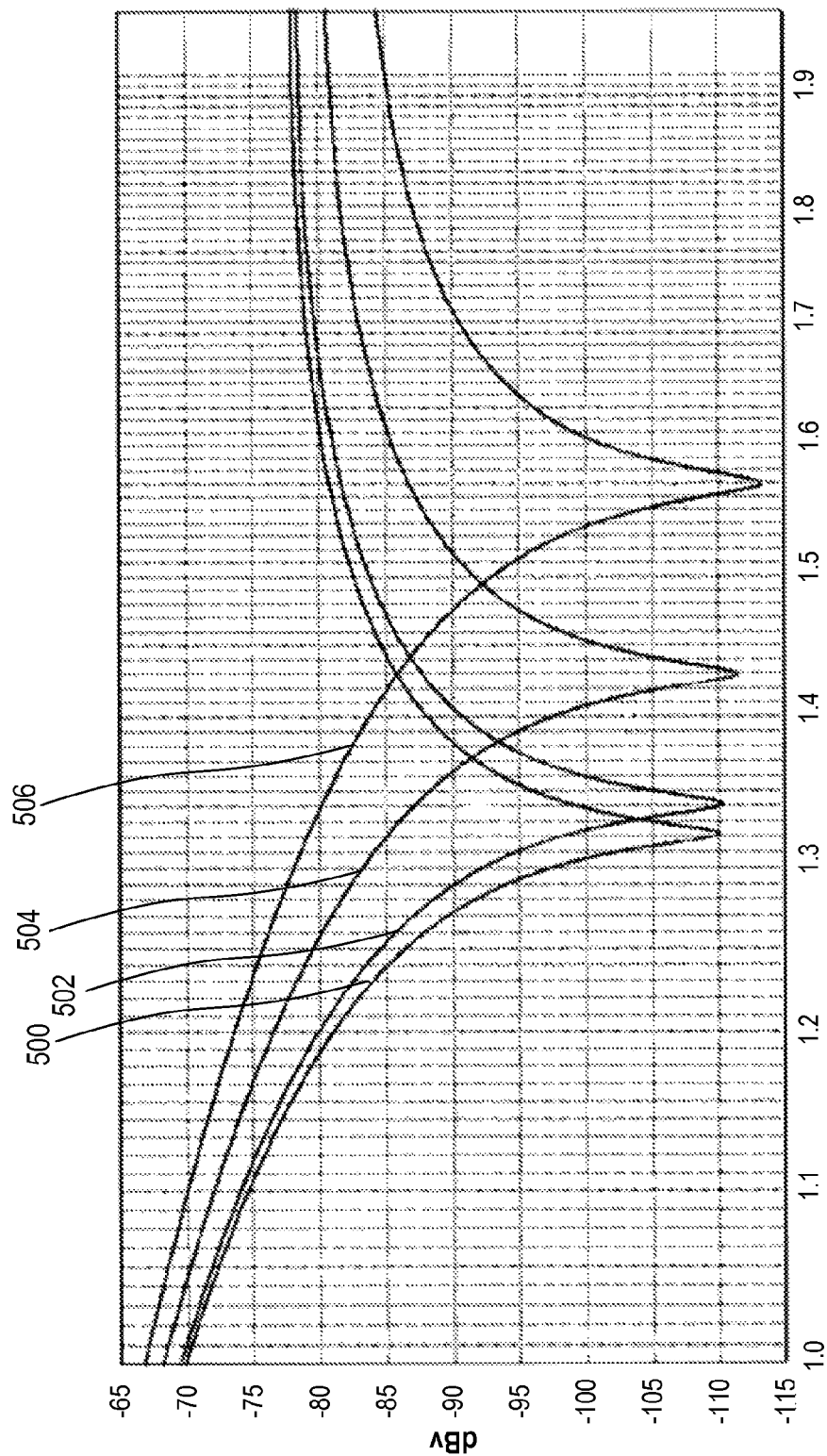
FIG. 5 illustrates generally an illustrative example of a simulation showing variation in resonant frequency for a resonant notch filter circuit when an inductor included as a portion of the resonant notch filter circuit is inductively coupled to another inductor according to various coupling coefficients.

FIG. 5 illustrates generally an illustrative example of a simulation showing variation in resonant frequency for a tuned filter circuit when an inductor comprising a tuned filter circuit is inductively coupled to another inductor elsewhere according to various coupling coefficients. At 500, the coupling coefficient, which can be represented by "K," is set at zero, providing a baseline example. At 502, the coupling coefficient is set at K=0.00001 (e.g., 0.001%), at 504, K=0.00005 (e.g., 0.005%), and at 506, K=0.0001 (e.g., 0.01%). The present inventors have recognized, among other things, that an 0.01% coupling coefficient can create a frequency shift in a resonant frequency of a tuned notch filter circuit in the range of about 20% relative to the baseline, such as placing the stop band of the notch filter in the example at 506 well away from the desired center frequency shown in the baseline example at 500. The units of the plot shown in FIG. 5 are decibels (dB) referenced to 1 volt (v), providing units of dBV, plotted versus frequency in megahertz (MHz).

Figure 6:
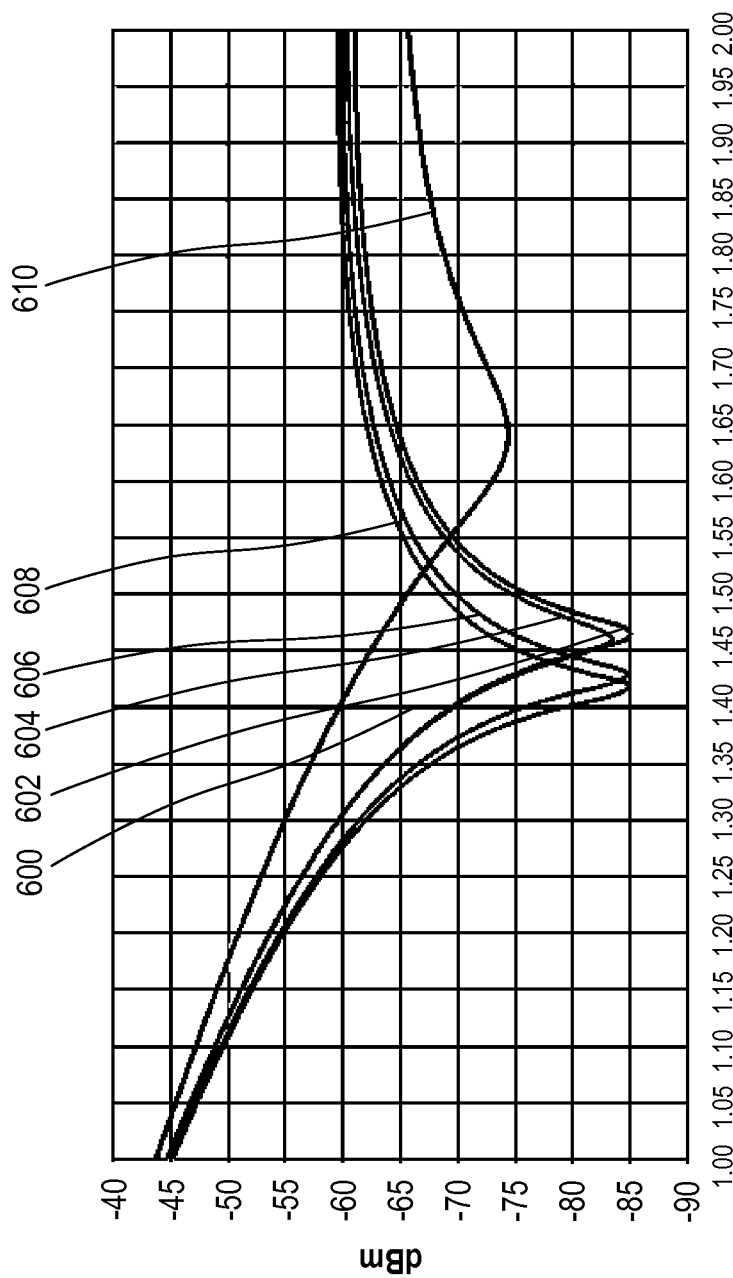
FIG. 6 illustrates generally an illustrative example of measured ripple attenuation for a test circuit including various shielding configurations.

By contrast with the example of FIG. 5, FIG. 6 illustrates generally an illustrative example of measured ripple attenuation for a test circuit including various magnetic shielding configurations. A printed circuit board incorporating a switching regulator having a storage inductor and a tuned notch filter inductor near each other was used to measure the influence of various magnetic shielding configurations. The layout for the printed circuit board included a distance between inductors of about 2.8 to 2.9 millimeters (mm), with the inductors oriented for broad-side coupling with an electrically-conductive magnetically-permeable shield vertically oriented and centered between the inductors (e.g., as shown illustratively in FIG. 3A and FIG. 3B). A target resonant frequency 600 of the tank-circuit ripple filter was established at 1.4 MHz, as shown in FIG. 6. A power level of ripple at the switching frequency was measured and is plotted in FIG. 6 in units dBm (decibels (dB) referenced to 1 milliwatt (mW) terminated in a reference impedance of 50 Ohms), and the switching frequency was swept across a range of frequencies from 1 MHz to 2 MHz. Table 1, below, summarizes a shift in resonant frequency for various shielding configurations.

TABLE 1

Examples corresponding to results shown illustratively in FIG. 6

| Shield (height × width × thickness in millimeters (mm)) | Measured Resonance (MHz) | Target Resonance (MHz) | % shift in frequency (e.g., error) | FIG. 6 reference |
|---|---|---|---|---|
| No shield | 1.64 | 1.4 | 17.14 | 610 |
| Mu Metal (4.8 × 7.26 × 0.6 mm) | 1.42 | 1.4 | 1.43 | 608 |
| Mu Metal (2.7 × 7.26 × 0.6 mm) | 1.43 | 1.4 | 2.14 | 606 |
| Mu Metal (1.7 × 3.7 × 0.6 mm) | 1.46 | 1.4 | 4.29 | 602 |
| Mu Copper (3.22 × 6.32 × 0.12 mm) | 1.46 | 1.4 | 4.29 | 604 |

Without being bound by theory, the results summarized in Table 1 above and shown in FIG. 6 illustrate generally that the electrically-conductive magnetically-permeable shield can reduce a shift in resonant frequency of a tuned notch filter circuit, such as by suppressing mutual magnetic coupling between an inductor in the tuned filter circuit and a storage inductor, even when the storage inductor and tuned filter circuit inductor are located in close proximity. Accordingly, an electronic module can include an electrically-conductive magnetically-permeable shield to suppress or inhibit such mutual magnetic coupling, as shown and described in other examples herein.

Figure 7:
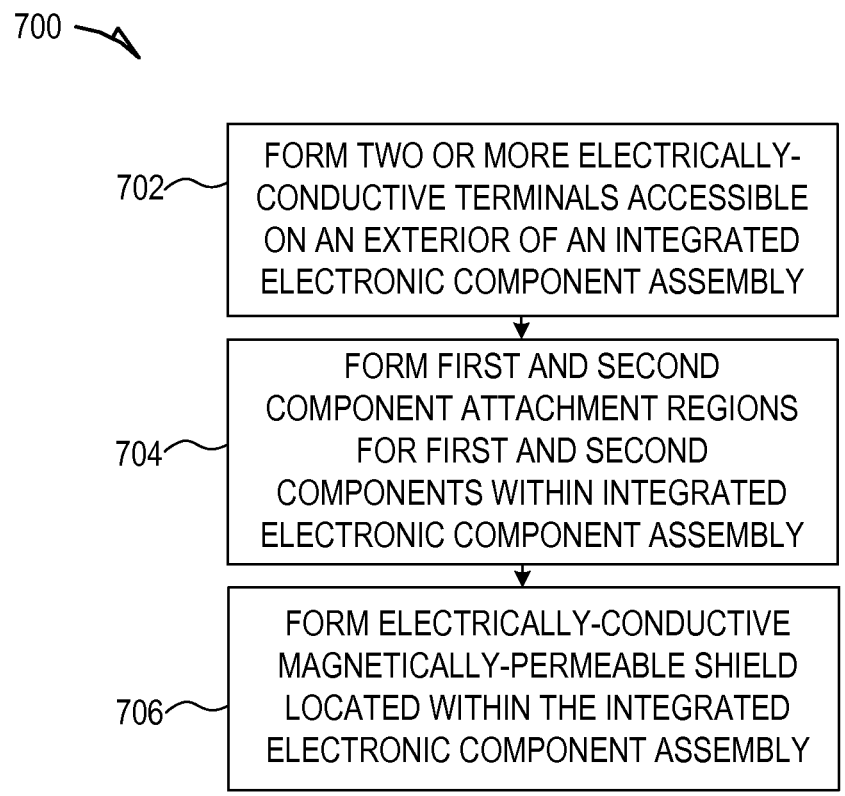
FIG. 7 illustrates generally a technique, such as a method, that can include forming an integrated electronic module including electrically-conductive terminals, component attachment regions, and an electrically-conductive magnetically-permeable shield.

FIG. 7 illustrates generally a technique, such as a method, that can include forming an integrated electronic module including electrically-conductive terminals, component attachment regions, and an electrically-conductive magnetically-permeable shield. At 702, two or more electrically-conductive terminals can be formed. The electrically-conductive terminals can be accessible on an exterior of an integrated electronic component assembly, such as coupled to or defined by an electrically-conductive structure included as a portion of the integrated electronic component assembly (e.g., as a portion of a module package). At 704, first and second component attachment regions can be formed, such as coupled to or defined by the electrically-conductive structure included as a portion of the integrated electronic component assembly. The first and second component attachment regions can provide locations to solder or otherwise electrically and mechanically coupled first and second components to the electrically-conductive structure (e.g., where the electrically-conductive structure includes a lead frame or metallization layer of a module package).

At 706, an electrically-conductive and magnetically-permeable shield can be formed. The shield can be located within the integrated electronic component assembly, such as having at least a portion extending in direction outward from a plane defined by the electrically-conductive structure elsewhere. The shield can be located between components, such as to reduce or suppress unwanted electrical coupling between the components. For example, the shield can be located between components such as inductors to reduce or inhibit mutual magnetic coupling between the inductors. The shield can be formed from the electrically-conductive structure, or mechanically and electrically attached to the electrically-conductive structure. An encapsulant can be applied to encapsulate the components and shield within an integrated electronic component assembly. In an example, a cover can be provided defining a cavity within which the shield and components are located.

VARIOUS NOTES & EXAMPLES

Example 1 can include or use subject matter (such as an apparatus, a method, a means for performing acts, or a device readable medium including instructions that, when performed by the device, can cause the device to perform acts), such as can include or use an integrated electronic component assembly, comprising an electrically-conductive structure, including two or more electrically-conductive terminals accessible on an exterior of the integrated electronic component assembly, a first component attachment region for a first component within the integrated electronic component assembly, and a second component attachment region for a second component within the integrated electronic component assembly, an electrically-conductive magnetically-permeable shield located within the integrated electronic component assembly, the electrically-conductive magnetically-permeable shield coupled to or defined by the electrically-conductive structure, the electrically-conductive magnetically-permeable shield located between the first and second component attachment regions, including a portion extending in a direction out of a plane defined by the first and second component attachment regions, to suppress magnetic coupling between the first and second components.

Example 2 can include, or can optionally be combined with the subject matter of Example 1, to optionally include that the electrically-conductive structure includes an integrated circuit die attachment region for an integrated circuit die, and that the first and second components comprise passive components.

Example 3 can include, or can optionally be combined with the subject matter of one or any combination of Examples 1 or 2 to optionally include the first and second components, and that the first and second components comprise inductors.

Example 4 can include, or can optionally be combined with the subject matter of Example 3, to optionally include that the inductors include a first inductor conductively and mechanically coupled to pads defined by the electrically-conductive structure located in the first component attachment region, and a second inductor conductively and mechanically coupled to pads defined by the electrically-conductive structure located in the second component attachment region, and that the electrically-conductive magnetically-permeable shield is configured to suppress or inhibit mutual inductive coupling between the first and second inductors as compared to an integrated electronic component assembly lacking the electrically-conductive magnetically-permeable shield.

Example 5 can include, or can optionally be combined with the subject matter of Example 4, to optionally include an integrated circuit die attachment region, and an integrated circuit die mechanically attached to the integrated circuit die attachment region, the integrated circuit including circuitry configured to provide at least a portion of a switched-mode regulator circuit, the first inductor comprising a storage inductor conductively coupled to the integrated circuit die, the second inductor comprising a portion a notch filter circuit, and the electrically-conductive magnetically-permeable shield configured to stabilize a notch frequency established by the notch filter circuit as compared to an integrated electronic component assembly lacking the electrically-conductive magnetically-permeable shield.

Example 6 can include, or can optionally be combined with the subject matter of one or any combination of Examples 1 or 5 to optionally include that the electrically-conductive structure includes a metallization layer coupled to a first dielectric material, the first dielectric material comprising a substrate for the integrated electronic component assembly.

Example 7 can include, or can optionally be combined with the subject matter of Example 6, to optionally include the first and second components and an encapsulant, and that the first and second components and the electrically-conductive magnetically-permeable shield are encapsulated by the encapsulant.

Example 8 can include, or can optionally be combined with the subject matter of Example 7, to optionally include that the first and second components and the electrically-conductive magnetically-permeable shield are located in a cavity within the encapsulant.

Example 9 can include, or can optionally be combined with the subject matter of Example 6, to optionally include a housing, and that the first and second components and the shield are located within a cavity defined at least in part by the housing.

Example 10 can include, or can optionally be combined with the subject matter of one or any combination of Examples 1 through 5 to optionally include the first and second components, the metallization layer comprising plated regions and interconnections, and that the first and second components are embedded within a dielectric material.

Example 11 can include, or can optionally be combined with the subject matter of one or any combination of Examples 1 through 5 to optionally include that the electrically-conductive structure includes an electrically-conductive lead frame.

Example 12 can include, or can optionally be combined with the subject matter of Example 11, to optionally include that the electrically-conductive magnetically-permeable shield is defined by a portion of the electrically-conductive lead frame.

Example 13 can include, or can optionally be combined with the subject matter of Example 12, to optionally include that the electrically-conductive magnetically-permeable shield is defined by a plated portion of the electrically-conductive lead frame, the plated portion comprising a magnetically-permeable plating material.

Example 14 can include or use subject matter (such as an apparatus, a method, a means for performing acts, or a device readable medium including instructions that, when performed by the device, can cause the device to perform acts), such as can include or use an integrated electronic component assembly, comprising an electrically-conductive structure comprising two or more electrically-conductive terminals accessible on an exterior of the integrated electronic component assembly, a first component attachment region for a first component within the integrated electronic component assembly, and a second component attachment region for a second component within the integrated electronic component assembly, along with an electrically-conductive magnetically-permeable shield located within the integrated electronic component assembly, the electrically-conductive magnetically-permeable shield coupled to or defined by the electrically-conductive structure, the electrically-conductive magnetically-permeable shield located between the first and second component attachment regions, including a portion extending in a direction out of a plane defined by the first and second component attachment regions, to suppress magnetic coupling between the first and second components, the first and second components comprising inductors including a first inductor conductively and mechanically coupled to pads defined by the electrically-conductive structure located in the first component attachment region, and a second inductor conductively and mechanically coupled to pads defined by the electrically-conductive structure located in the second component attachment region, and the electrically-conductive magnetically-permeable shield configured to suppress or inhibit mutual inductive coupling between the first and second inductors as compared to an integrated electronic component assembly lacking the electrically-conductive magnetically-permeable shield.

Example 15 can include, or can optionally be combined with the subject matter of one or any combination of Examples 1 through 14 to include, subject matter (such as an apparatus, a method, a means for performing acts, or a machine readable medium including instructions that, when performed by the machine, that can cause the machine to perform acts), such as can forming an integrated electronic component assembly, including forming an electrically-conductive structure comprising two or more electrically-conductive terminals accessible on an exterior of the integrated electronic component assembly, a first component attachment region for a first component within the integrated electronic component assembly, and a second component attachment region for a second component within the integrated electronic component assembly, and forming an electrically-conductive magnetically-permeable shield located within the integrated electronic component assembly, the electrically-conductive magnetically-permeable shield coupled to or defined by the electrically-conductive structure, the electrically-conductive magnetically-permeable shield located between the first and second component attachment regions, including a portion extending in a direction out of a plane defined by the first and second component attachment regions, to suppress magnetic coupling between the first and second components.

Example 16 can include, or can optionally be combined with the subject matter of Example 15, to optionally include that the electrically-conductive structure includes an integrated circuit die attachment region for an integrated circuit die, and that the first and second components comprise passive components.

Example 17 can include, or can optionally be combined with the subject matter of Example 16, to optionally include that the first and second components comprise inductors, and a technique comprising conductively and mechanically coupling a first inductor to pads defined by the electrically-conductive structure located in the first component attachment region, and conductively and mechanically coupling a second inductor to pads defined by the electrically-conductive structure located in the second component attachment region, where the electrically-conductive magnetically-permeable shield is configured to suppress or inhibit mutual inductive coupling between the first and second inductors as compared to an integrated electronic component assembly lacking the electrically-conductive magnetically-permeable shield.

Example 18 can include, or can optionally be combined with the subject matter of Example 16, to optionally include mechanically attaching an integrated circuit die to the integrated circuit die attachment region, the integrated circuit including circuitry configured to provide at least a portion of a switched-mode regulator circuit, the first inductor comprising a storage inductor conductively coupled to the integrated circuit die, the second inductor comprising a portion of a notch filter circuit, and that the electrically-conductive magnetically-permeable shield is configured to stabilize a notch frequency established by the notch filter circuit as compared to an integrated electronic component assembly lacking the electrically-conductive magnetically-permeable shield.

Example 19 can include, or can optionally be combined with the subject matter of one or any combination of Examples 15 or 18 to optionally include encapsulating the first and second components and the electrically-conductive magnetically-permeable shield using an encapsulant.

Example 20 can include, or can optionally be combined with the subject matter of Example 19, to optionally include that the first and second components and the electrically-conductive magnetically-permeable shield are located in a cavity within the encapsulant.

Example 21 can include, or can optionally be combined with the subject matter of one or any combination of Examples 15 or 18 to optionally include forming a housing, and that the first and second components and the shield are located within a cavity defined at least in part by the housing.

Example 22 can include, or can optionally be combined with the subject matter of one or any combination of Examples 15 or 18 to optionally include that the metallization layer comprises plated regions and interconnections, and that the first and second components are embedded within a dielectric material.

Example 23 can include, or can optionally be combined with the subject matter of one or any combination of Examples 15 or 18 to optionally include forming the electrically-conductive structure including forming an electrically-conductive lead frame.

Example 24 can include, or can optionally be combined with the subject matter of Example 23, to optionally include that the electrically-conductive magnetically-permeable shield is defined by a portion of the electrically-conductive lead frame.

Each of these non-limiting examples can stand on its own, or can be combined in various permutations or combinations with one or more of the other examples.

The above detailed description includes references to the accompanying drawings, which form a part of the detailed description. The drawings show, by way of illustration, specific embodiments in which the invention can be practiced. These embodiments are also referred to herein as "examples." Such examples can include elements in addition to those shown or described. However, the present inventors also contemplate examples in which only those elements shown or described are provided. Moreover, the present inventors also contemplate examples using any combination or permutation of those elements shown or described (or one or more aspects thereof), either with respect to a particular example (or one or more aspects thereof), or with respect to other examples (or one or more aspects thereof) shown or described herein.

In the event of inconsistent usages between this document and any documents so incorporated by reference, the usage in this document controls.

In this document, the terms "a" or "an" are used, as is common in patent documents, to include one or more than one, independent of any other instances or usages of "at least one" or "one or more." In this document, the term "or" is used to refer to a nonexclusive or, such that "A or B" includes "A but not B," "B but not A," and "A and B," unless otherwise indicated. In this document, the terms "including" and "in which" are used as the plain-English equivalents of the respective terms "comprising" and "wherein." Also, in the following claims, the terms "including" and "comprising" are open-ended, that is, a system, device, article, composition, formulation, or process that includes elements in addition to those listed after such a term in a claim are still deemed to fall within the scope of that claim. Moreover, in the following claims, the terms "first," "second," and "third," etc. are used merely as labels, and are not intended to impose numerical requirements on their objects.

Method examples described herein can be machine or computer-implemented at least in part. Some examples can include a computer-readable medium or machine-readable medium encoded with instructions operable to configure an electronic device to perform methods as described in the above examples. An implementation of such methods can include code, such as microcode, assembly language code, a higher-level language code, or the like. Such code can include computer readable instructions for performing various methods. The code may form portions of computer program products. Further, in an example, the code can be tangibly stored on one or more volatile, non-transitory, or non-volatile tangible computer-readable media, such as during execution or at other times. Examples of these tangible computer-readable media can include, but are not limited to, hard disks, removable magnetic disks, removable optical disks (e.g., compact disks and digital video disks), magnetic cassettes, memory cards or sticks, random access memories (RAMs), read only memories (ROMs), and the like.

The above description is intended to be illustrative, and not restrictive. For example, the above-described examples (or one or more aspects thereof) may be used in combination with each other. Other embodiments can be used, such as by one of ordinary skill in the art upon reviewing the above description. The Abstract is provided to comply with 37 C.F.R. § 1.72(b), to allow the reader to quickly ascertain the nature of the technical disclosure. It is submitted with the understanding that it will not be used to interpret or limit the scope or meaning of the claims. Also, in the above Detailed Description, various features may be grouped together to streamline the disclosure. This should not be interpreted as intending that an unclaimed disclosed feature is essential to any claim. Rather, inventive subject matter may lie in less than all features of a particular disclosed embodiment. Thus, the following claims are hereby incorporated into the Detailed Description as examples or embodiments, with each claim standing on its own as a separate embodiment, and it is contemplated that such embodiments can be combined with each other in various combinations or permutations. The scope of the invention should be determined with reference to the appended claims, along with the full scope of equivalents to which such claims are entitled.

The claimed invention is:

1. An integrated electronic component assembly, comprising:
   a first inductor;
   a second inductor;
   an electrically-conductive structure comprising an integrated circuit die attachment region and pads to which the first and second inductors are mechanically and electrically attached;
   an electrically-conductive magnetically-permeable shield located within the integrated electronic component assembly, the electrically-conductive magnetically-permeable shield coupled to the electrically-conductive structure or defined by the electrically-conductive structure, the electrically-conductive magnetically-permeable shield located between the first and second inductors, including a portion extending in a direction out of a plane defined by the pads;
an integrated circuit die mechanically attached to the integrated circuit die attachment region, the integrated circuit including circuitry configured to provide at least a portion of a switched-mode regulator circuit; and
wherein the first inductor comprises a storage inductor conductively coupled to the integrated circuit die;
wherein the second inductor comprises a portion a notch filter circuit; and
wherein the electrically-conductive magnetically-permeable shield is configured to stabilize a notch frequency established by the notch filter circuit as compared to an integrated electronic component assembly lacking the electrically-conductive magnetically-permeable shield.

2. The integrated electronic component assembly of claim 1, wherein the electrically-conductive structure includes a metallization layer coupled to a first dielectric material, the first dielectric material comprising a substrate for the integrated electronic component assembly.

3. The integrated electronic component assembly of claim 1, wherein the electrically-conductive structure includes an electrically-conductive lead frame.

4. The integrated electronic component assembly of claim 2, further comprising an encapsulant;
wherein the first and second inductors and the electrically-conductive magnetically-permeable shield are encapsulated by the encapsulant.

5. The integrated electronic component assembly of claim 2, further comprising a housing;
wherein the first and second inductors and the shield are located within a cavity defined at least in part by the housing.

6. The integrated electronic component assembly of claim 3, wherein the electrically-conductive magnetically-permeable shield is defined by a portion of the electrically-conductive lead frame.

7. The integrated electronic component assembly of claim 4, wherein the first and second inductors and the electrically-conductive magnetically-permeable shield are located in a cavity within the encapsulant.

8. The integrated electronic component assembly of claim 6, wherein the electrically-conductive magnetically-permeable shield is defined by a plated portion of the electrically-conductive lead frame, the plated portion comprising a magnetically-permeable plating material.

9. A method for forming an integrated electronic component assembly, the method comprising:
forming an electrically-conductive structure comprising an integrated circuit die attachment region and pads to which first and second inductors are mechanically and electrically attached: and
forming an electrically-conductive magnetically-permeable shield located within the integrated electronic component assembly, the electrically-conductive magnetically-permeable shield coupled to the electrically-conductive structure or defined by the electrically-conductive structure, the electrically-conductive magnetically-permeable shield located between the first and second inductors, including a portion extending in a direction out of a plane defined by the first and second component attachment regions; and
mechanically attaching an integrated circuit die to the integrated circuit die attachment region, the integrated circuit including circuitry configured to provide at least a portion of a switched-mode regulator circuit;
wherein the first inductor comprises a storage inductor conductively coupled to the integrated circuit die;
wherein the second inductor comprises a portion a notch filter circuit; and
wherein the electrically-conductive magnetically-permeable shield is configured to stabilize a notch frequency established by the notch filter circuit as compared to an integrated electronic component assembly lacking the electrically-conductive magnetically-permeable shield.

10. The method of claim 9, further comprising encapsulating the first and second inductors and the electrically-conductive magnetically-permeable shield using an encapsulant.

11. The method of claim 9, further comprising forming a housing;
wherein the first and second inductors and the shield are located within a cavity defined at least in part by the housing.

12. The method of claim 9, wherein the electrically-conductive structure includes a metallization layer coupled to a first dielectric material, the first dielectric material comprising a substrate for the integrated electronic component assembly;
wherein the metallization layer comprises plated regions and interconnections.

13. The method of claim 9, wherein forming the electrically-conductive structure includes forming an electrically-conductive lead frame.

14. The method of claim 10, wherein the first and second inductors and the electrically-conductive magnetically-permeable shield are located in a cavity within the encapsulant.

15. The method of claim 13, wherein the electrically-conductive magnetically-permeable shield is defined by a portion of the electrically-conductive lead frame.

16. The method of claim 15, wherein the electrically-conductive magnetically-permeable shield is defined by a plated portion of the electrically-conductive lead frame, the plated portion comprising a magnetically-permeable plating material.

17. A method of operating a switched-mode regulator circuit included in an integrated electronic component assembly, comprising:
storing energy in a first inductor electrically and mechanically coupled to first pads, the first inductor forming a portion of the switched-mode regulator circuit;
filtering an output of the switched-mode regulator circuit using a notch filter comprising a second inductor, the second inductor electrically and mechanically coupled to second pads;
suppressing magnetic coupling between the first and second inductors using an electrically-conductive, magnetically-permeable shield located within the integrated electronic component assembly and located between the first and second inductors, the electrically-conductive magnetically-permeable shield including a portion extending in a direction out of a plane defined by the first pads and the second pads;
wherein an integrated circuit comprising at least a portion of the switched-mode regulator circuit, the first inductor, the second inductor, and the electrically-conductive magnetically-permeable shield are located within the integrated electronic component assembly; and
wherein the electrically-conductive magnetically-permeable shield is coupled to an electrically-conductive structure or defined by the electrically-conductive structure, the electrically-conductive structure comprising the first pads, the second pads, and an integrated circuit die attachment region to which the integrated circuit is attached.

18. The method of claim 17, wherein the electrically-conductive magnetically-permeable shield is coupled to an electrically-conductive structure.

19. The method of claim 17, wherein the electrically-conductive magnetically-permeable shield is defined by the electrically-conductive structure.

20. The method of claim 19, wherein the electrically-conductive magnetically-permeable shield is defined by a portion of an electrically-conductive lead frame.

* * * * *